United States Patent [19]

Lampert et al.

[11] Patent Number: 4,692,223

[45] Date of Patent: Sep. 8, 1987

[54] PROCESS FOR POLISHING SILICON WAFERS

[75] Inventors: Ingolf Lampert; Herbert Jacob, both of Burghausen, Fed. Rep. of Germany

[73] Assignee: Wacker-Chemitronic Gesellschaft fur Elektronik-Grundstoffe mbH, Burghausen, Fed. Rep. of Germany

[21] Appl. No.: 859,636

[22] Filed: May 5, 1986

[30] Foreign Application Priority Data

May 15, 1985 [DE] Fed. Rep. of Germany ....... 3517665

[51] Int. Cl.⁴ ............................................... B24B 1/00
[52] U.S. Cl. .................................. 204/34.5; 204/56.1; 51/283 R; 51/323; 51/326
[58] Field of Search .................. 51/131.3, 283 R, 292, 51/317, 322, 323, 326; 204/34.5, 56.1, 57, 129.46

[56] References Cited

U.S. PATENT DOCUMENTS

| | | | |
|---|---|---|---|
| 2,875,384 | 2/1959 | Wallmark | 204/34.5 X |
| 3,377,258 | 4/1968 | Schmidt et al. | 204/34.5 X |
| 3,429,080 | 2/1969 | Lachapelle | 51/317 X |
| 3,764,491 | 10/1973 | Schwartz | 204/56.1 |
| 4,064,660 | 12/1977 | Lampert | 51/317 X |
| 4,070,797 | 1/1978 | Griesshammer et al. | 51/326 |
| 4,092,445 | 5/1978 | Tsuzuki et al. | 204/34.5 X |

FOREIGN PATENT DOCUMENTS 1449702 9/1976 United Kingdom .

Primary Examiner—Robert P. Olzewski
Attorney, Agent, or Firm—Collard, Roe & Galgano

[57] ABSTRACT

A process for polishing silicon wafers includes the step of carrying out the last polishing step in the polishing operation in such a way that a protective film of silicon dioxide is produced on the surface of the polished wafer. The film does not interfere with e.g., the subsequent oxidation processes. The protective film protects the wafer surface from the many effects arising in subsequent processes which may unfavorably influence the quality of the surface.

13 Claims, 1 Drawing Figure

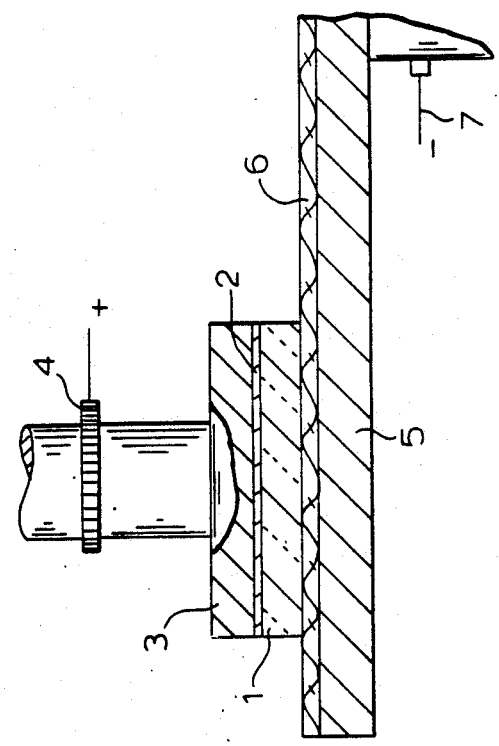

PROCESS FOR POLISHING SILICON WAFERS

BACKGROUND OF THE INVENTION

The invention relates to a process for polishing silicon wafers. More particularly, the invention relates to a process for polishing silicon wafers wherein a protective film is produced on the wafer surface thereby assuring the quality of the wafer surface.

A number of methods of polishing silicon wafers have become known, including, for example, the process according to German Pat. DE-OS No. 23 05 188 or U.S. Pat. No. 4,070,797.

The common feature of the known methods is that the polished wafers are exposed to many influences during the period between the actual polishing step and the final drying and packaging. These influences or effects include, for example, uncontrolled chemical reactions caused by residual amounts of the generally alkaline polishing agent still adhering to the wafers, and by cleaning solutions or water. These effects may cause a deterioration of the quality of the surface which is noticed as a so-called "haze" when the surface is inspected under a sharply focused intense light beam, i.e., as a milky-grey area at the point of incidence. The milky-gray areas are caused by the scattering of the light in slightly roughened sections of the area. In the manufacture of electronic components, however, it is of the utmost importance to have silicon wafers which are haze-free, primarily in view of the fact that increasingly exacting surface quality requirements have to be satisfied. These requirements relate primarily to the constantly progressing miniaturization of electronic components and the need to have silicon wafers which do not have these effects on surface quality that are detachable or observable as a haze.

Accordingly, it is an object of the invention to provide a method of polishing silicon wafers which assures that the quality of the surface of the polished wafers is not influenced by the processing or finishing steps which follow the polishing step.

SUMMARY OF THE INVENTION

The foregoing and related objects are readily attained in a process for polishing silicon wafers wherein the polishing step is ended with a treatment in which a silicon dioxide film is produced on the surface of the polished silicon.

BRIEF DESCRIPTION OF THE DRAWING

The drawing is a fragmentarily-illustrated schematical side elevational view in part section of an apparatus for carrying out one embodiment of the process of the invention.

DETAILED DESCRIPTION OF THE PREFERRED EMBODIMENTS

The process of the invention may be carried out as a purely chemical oxidizing method, and also as an anodic oxidation method as exemplified in the drawing. The process can be achieved in a particularly simple manner generally by adding an oxidizing agent or oxidizing agent mixture, at the end of the polishing step, to the alkaline polishing agent flowing onto the workpiece surface. The oxidizing agent or mixture has a potential in alkaline solution of at least approximately 0.52 volts as compared to the standard hydrogen electrode. Such oxidizing agents include, for example, permanganates, peroxodisulfates, hypobromites, hypochlorites, or hydrogen peroxide. Preferably, the oxidizers are used in the form of compounds which do not introduce any additional foreign cations into the polishing system. Therefore, oxidizers primarily in the form of sodium salts, potassium salts, or stable ammonium salts are used. The cations are usually harmless because potassium, sodium or ammonium compounds are normally also contained in the polishing agent. However, it is especially advantageous if hydrogen peroxide is used, which by its nature, cannot introduce any additional foreign ions.

In most cases, it is sufficient to add the oxidizing component to the polishing agent in an amount such that its proportion comes to from about 0.1 to 2 percent by volume, based on the polishing agent to which it is added. Higher proportions are basically not excluded, however, any higher proportions do not, in most cases, lead to any superior results. In practice the oxidizers are added in the form of aqueous solutions.

After adding the oxidizing component to the polishing agent, it is generally sufficient to continue the polishing step for a brief period under otherwise unchanged conditions, for example, for from 0.5 to 5 minutes, preferably for from one to two minutes. It is known from experience that this period suffices for coating the polished surface with an even or uniform layer or coat of silicon dioxide resulting from the action of the oxidizer on the surface. In general, with the help of the above-mentioned oxidizing elements, it is possible to achieve coatings with thicknesses in the range of from approximately 10 to 50 Å. In most cases, even this extremely thin film of oxide prevents, on completion of the polishing step, other uncontrolled reactions that could unfavorably affect the perfectly polished surface of the wafer beneath the film.

The purely chemical oxidizing methods described above are basically comparable to the passivating methods known in connection with, for example, aluminum surfaces. Accordingly, the oxide films cannot be applied to any desired thickness, but, as experience has shown, can only be applied up to a defined limit value even if the oxidizer is permitted to act for a long period. The limit value is in the range of less than 50 Å in most cases.

However, higher thicknesses of the oxide film can be achieved by anodic oxidation of the polished silicon surface. In producing such higher thicknesses, it is possible to set or adjust the required change in potential, for example, in a circuit as shown in the drawing in which wafer 1 to be polished serves as the anode and a polishing disk 5 serves as the cathode. Silicon wafer 1 may be fixed via a conductive adhesive foil 2 to a rotating carrier plate 3 which is anodically poled by a sliding electrical contact 4. Polishing disk 5, which may also be rotating, is in contact with the bottom surface of wafer 1, and may be cathodically poled by a sliding electrical contact 7. The circuit is closed via a polishing cloth 6 which is stretched across disk 5 and is impregnated with an ionically conductive polishing agent. For this purpose, suitable polishing agents are, for example, the agents usually used for polishing silicon wafers in an alkaline medium.

Basically, it is also possible to continue the polishing step during the anodic oxidation step under otherwise unchanged conditions. However, it is more favorable to reduce the rate of material removal by suitable measures, for example by reducing the pressure and/or the temperature because this also permits a reduction of the required voltages and current densities. In practice, the suitable parameters are determined by preliminary tests. Generally, for the oxidation, voltages of from $-1$ to $+2$ volts (measured against a Calomel electrode) and current densities of from 0.1 to 5 mA/cm$^2$ were found to be useful, although the application of higher voltages and current densities is not excluded, for example, if a particularly rapid rate of oxidation is deemed desirable.

Basically, the anodic oxidation method does in fact permit higher thicknesses of the silicon dioxide coating as compared to adding chemical oxidizers during polishing. However, the anodic oxidation method requires a comparatively higher expenditure for requirement. Thus, the anodic oxidation process is use mainly if silicon wafers are desired which have a film of silicon dioxide across their polished surface, with a thickness which, by the chemical oxidation method, can be produced only at a high expense, if at all. Otherwise, the simpler and less costly (in terms of equipment requirements) chemical oxidizer is used. A special advantage of the chemical oxidizer method is that the addition of the oxidizing component results, in most cases, in a clearly reduced removal of material in the polishing step so that the desired formation of the oxide coating is not interfered with by excessive material removal.

In the process according to the present invention, the high quality of the polished surface, achieved in the course of the polishing step may by means of the coating applied directly on completion of the polishing step, be preserved in both one-side and two-side polishing of silicon wafers. The subsequent processing steps such as, for example, cleaning, rinsing, drying, etc., can in this way no longer act directly on the surface, but only on the applied protective film of silicon dioxide. This means that the silicon surface is available in a perfectly polished, undisturbed state for the processing steps following in the manufacture of electronic components. Oxidation processes, for example of a thermal nature, are not impaired by the extremely thin film of silicon dioxide coating the silicon surface, and neither are the cleaning steps such as, e.g., de-dusting. On the other hand, if need be, the oxide film can be readily removed again, for example by short-time etching with, e.g., hydrofluoric acid, in order to expose the silicon surface.

The invention will now be explained more fully in a number of examples which are, however, only given by way of illustration and not of limitation.

EXAMPLE 1

Twelve silicon wafers (diameter=125 mm) were fastened onto a commonly used carrier plate with conductive adhesive foil without using cement. The carrier plate was subsequently placed in a conventional polishing machine. Via sliding contacts, it was possible to anodically pole or bias the carrier plate together with the silicon wafers resting thereon. The polishing disk was connected as the cathodic electrode, and the polishing cloth, which was stretched across the polishing disk and impregnated with polishing agent, served for closing the circuit.

Initially, polishing was carried out for about 25 minutes without application of voltage under the usual polishing conditions (pressure about 0.5 bar; temperature about 50° C.) with a continuous feed of a commerical alkaline polishing agent based on silica sol, at a pH of about 11.5, until a material removal of about 40 μm was achieved. Subsequently, the circuit was closed (voltage approximately 0.9 V, current density approximately 2.5 mA/cm$^2$) and the pressure was simultaneously reduced to 0.1 bar. Under these conditions, the polishing action was continued for another two minutes, during which period no further or additional material was found to be removed by the polishing action.

On completion of the polishing operation, the wafers were left undisturbed in the switched-off polishing machine for another 30 minutes, in order to permit the polishing agent to further act on the wafers. Subsequently, the wafers were removed and cleaned. The thickness of the silicon dioxide coatings so applied was determined, with an ellipsometer, to be 90 Å.

On three of the wafers, the oxide coating was removed again by etching with hydrofluoric acid. In the sharply focussed light beam it was found that the exposed silicon surface was completely haze-free.

COMPARISION EXAMPLE 1a

Twelve additional wafers were polished in the same way, but without the anodic oxidation step and exposed for another 30 minutes in the switched off polishing machine to the action of the polishing agent on completion of the polishing step. On removal and cleaning, the polished surface of the wafers clearly exhibited haze.

EXAMPLE 2

Eight silicon wafers (diameter=125 mm, (100)-orientation) were polished under the equal polishing conditions (polishing pressure about 0.5 bar; temperature about 50° C.) in a polishing machine for the 2-side polishing of silicon wafers. First, during the 20 minute polishing operation, a commercial alkaline polishing agent based on silica sol was pumped onto the polishing cloth from a supply vessel. Thereafter, a 30% solution of hydrogen peroxide was added to the polishing agent contained in the supply vessel, until the polishing agent had a concentration of 1% peroxide by volume.

Without interrupting the polishing operation, polishing was continued for another minute with continued feed of the now-peroxide-containing polishing agent under otherwise unchanged conditions. The material removal was clearly reduced during the 1-minute period and the wafers were coated with a thin film of silicon dioxide.

On completion of the polishing operation the wafers were removed and relieved from adhering residual amounts of polishing agent. The density of the oxide coating applied to the surface of the wafers was determined with an ellipsometer to be 18 Å. The inspection under the light beam established that both surfaces of the wafers were completely haze-free.

COMPARISON EXAMPLE 2a

In another polishing operation, eight wafers with the same specifications were treated in the same way, but without adding hydrogen peroxide at the end of the polishing step. The inspection under the light beam showed that three of the resulting wafers had the so-called "haze" on one surface.

Thus, while only several embodiments and examples of the invention have been shown and described, it will be obvious that many changes and modifications may be made thereunto, without departing from the spirit and scope of the invention.

What is claimed is:

1. In a process for polishing silicon wafer surfaces, the improvement comprising the steps of:

initially polishing the wafer surface in a conventional manner under alkaline conditions until a high quality of said polished surface is achieved; and thereafter, without interruption of the polishing, continuing and completing the polishing operation under oxidizing conditions by adding an oxidizing agent or anodic oxidation, thereby producing a film of silicon dioxide on the polished silicon wafer surface.

2. The process according to claim 1, wherein the silicon dioxide film is produced with a thickness of at least 10 Å.

3. The process according to claim 1, wherein the silicon dioxide film is produced by anodic oxidation by means of a voltage source in a circuit with anodically poled silicon wafers.

4. The process according to claim 1, wherein the silicon dioxide film is produced with an oxidizer having a potential in alkaline solution in excess of approximately 0.52 volts measured against a standard hydrogen electrode.

5. The process according to claim 4, wherein the oxidizer is a member selected from the group consisting of permanganates, peroxodisulfates, hypobromites, hypochlorites, hydrogen peroxide, and a combination thereof.

6. The process according to claim 4, wherein the oxidizer is a member selected from the group consisting of sodium salts, potassium salts, stable ammonium salts, and a combination thereof.

7. The process according to claim 4, wherein the oxidizer is in the form of an aqueous solution.

8. The process according to claim 4, wherein the oxidizer is added to a polishing agent in an amount such that the oxidizer makes up from approximately 0.1 to 2.0% by volume of the polishing agent.

9. The process according to claim 8, wherein after the oxidizer is added to the polishing agent, polishing of the wafer continues for from approximately 0.5 to 5.0 minutes.

10. The process according to claim 3, wherein a polishing disk serves as a cathode and a closed circuit is formed by a polishing cloth impregnated with an ionically conductive polishing agent.

11. The process according to claim 10, wherein a voltage of from approximately $-1$ to $+2$ volts measured against a Calomel electrode is established between the anode and cathode.

12. The process according to claim 10, wherein a current density of from approximately 0.1 to 5 mA/cm$^2$ is established between the anode and cathode.

13. The process according to claim 1, wherein the silicon wafers have a diameter of at least 125 mm.

* * * * *